United States Patent
Senoo (10) Patent No.: US 10,256,232 B2
(45) Date of Patent: Apr. 9, 2019

(54) SEMICONDUCTOR DEVICE INCLUDING A SWITCHING ELEMENT AND A SENSE DIODE

(71) Applicant: TOYOTA JIDOSHA KABUSHIKI KAISHA, Toyota-shi, Aichi-ken (JP)

(72) Inventor: Masaru Senoo, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/866,963

(22) Filed: Jan. 10, 2018

(65) Prior Publication Data
US 2018/0240795 A1 Aug. 23, 2018

(30) Foreign Application Priority Data
Feb. 23, 2017 (JP) .................. 2017-032283

(51) Int. Cl.
  *H01L 29/40* (2006.01)
  *H01L 27/06* (2006.01)
  *H01L 21/768* (2006.01)
  *H01L 23/00* (2006.01)
  *H01L 29/423* (2006.01)
  *H01L 29/49* (2006.01)
  *H01L 29/861* (2006.01)

(52) U.S. Cl.
  CPC .... *H01L 27/0629* (2013.01); *H01L 21/76805* (2013.01); *H01L 24/02* (2013.01); *H01L 27/0676* (2013.01); *H01L 29/4236* (2013.01); *H01L 29/4916* (2013.01); *H01L 29/8611* (2013.01)

(58) Field of Classification Search
CPC . H01L 27/0629; H01L 29/4916; H01L 24/02; H01L 21/76805; H01L 29/8611; H01L 29/4236; H01L 27/0676
See application file for complete search history.

(56) References Cited

U.S. PATENT DOCUMENTS 3,584,281 A * 6/1971 Reeves .................. H02P 7/293
                                                     318/258
6,148,258 A * 11/2000 Boisvert ............... F02P 19/022
                                                     123/145 A
(Continued)

FOREIGN PATENT DOCUMENTS

JP  2014-216932 A  11/2014
JP  2016-149715 A   8/2016

*Primary Examiner* — Ismail A Muse
(74) *Attorney, Agent, or Firm* — Oliff PLC (57) ABSTRACT

A semiconductor device provided herein includes: a semiconductor substrate; an upper main electrode provided above the semiconductor substrate; a sense anode electrode provided above the semiconductor substrate; a resistance layer provided above the semiconductor substrate and having a resistivity higher than the sense anode electrode; a lower main electrode provided below the semiconductor substrate. The semiconductor substrate includes a switching element and a sense diode. The switching element is connected between the upper main electrode and the lower main electrode. The sense diode comprises a first anode region of a p-type connected to the sense anode electrode via the resistance layer and a first cathode region of an n-type connected to the lower main electrode.

4 Claims, 6 Drawing Sheets

(56) References Cited

U.S. PATENT DOCUMENTS

| | | | |
|---|---|---|---|
| 2001/0043049 A1* | 11/2001 | Cochoy | B60L 11/1805 318/801 |
| 2003/0030410 A1* | 2/2003 | Cochoy | B60L 11/1805 318/801 |
| 2016/0036433 A1* | 2/2016 | Toshiyuki | H02M 7/538 327/109 |
| 2016/0088243 A1* | 3/2016 | Higashi | H01L 27/14612 348/294 |
| 2016/0241242 A1* | 8/2016 | Toshiyuki | H03K 19/01806 |
| 2017/0236908 A1* | 8/2017 | Naito | G01K 13/00 257/48 |
| 2018/0240792 A1* | 8/2018 | Senoo | H01L 24/05 |

\* cited by examiner

SEMICONDUCTOR DEVICE INCLUDING A SWITCHING ELEMENT AND A SENSE DIODE

TECHNICAL FIELD

The technique disclosed herein relates to a semiconductor device.

BACKGROUND

Japanese Patent Application Publication No. 2016449715 discloses a semiconductor device in which a switching element and a protection diode are provided in a common semiconductor substrate. A cathode electrode of the protection diode is connected to one terminal of the switching element. An anode electrode of the protection diode is connected to an external circuit. A potential of the anode electrode of the protection diode varies depending on a potential of the one terminal of the switching element. The technique described in Japanese Patent Application Publication No. 2016-149715, determines whether or not a freewheel diode connected in parallel to the switching element is turned on according to the potential of the anode electrode in the protection diode. When the freewheel diode is turned off, the external circuit allows the switching element to be turned on.

SUMMARY

Like the protection diode described in Japanese Patent Application Publication No. 2016449715, when the cathode electrode of the diode is connected to one terminal of the switching element, the potential of the anode electrode in the diode varies depending on the potential of the terminal. This type of diode can be used to determine an operating state of the switching element based on the potential of the terminal of the switching element even in any method other than the usage method described in Japanese Patent Application Publication No. 2016-149715 (i.e., determination of the on state of the freewheel diode). Hereinafter, this type of diode will be referred to as a sense diode.

When the sense diode and the switching element are provided on a single semiconductor substrate, an upper main electrode and a sense anode electrode can be provided at an upper surface of the semiconductor substrate, and a lower main electrode can be provided at a lower surface of the semiconductor substrate. An anode layer of a p-type of the sense diode is connected to a sense anode electrode, whereas a cathode layer of an n-type of the sense diode is connected to a lower main electrode. The switching element is connected between the upper main electrode and the lower main electrode. That is, the switching element and the sense diode are connected together at the lower main electrode. In other words, the lower main electrode serves as one terminal of the switching element and also as a cathode electrode of the sense diode. Since both the upper main electrode and the sense anode electrode are provided above the semiconductor substrate, a parasitic capacitance exists between the upper main electrode and the sense anode electrode.

Figure 6:
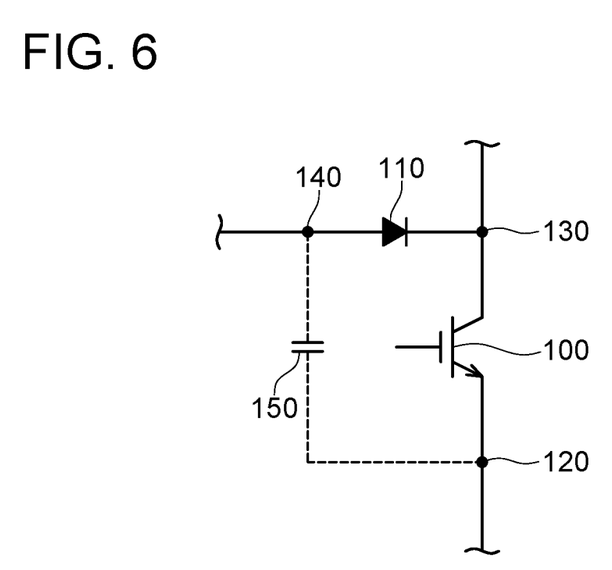
FIG. 6 is a circuit diagram of the semiconductor device having a sense diode 110.

FIG. 6 shows a circuit diagram of the semiconductor device. Specifically, FIG. 6 shows a switching element 100, a sense diode 110, an upper main electrode 120, a lower main electrode 130, a sense anode electrode 140, and a parasitic capacitance 150. Although FIG. 6 shows the switching element 100 configured of an Insulated Gate Bipolar Transistor (IGBT), the switching element 100 may be other switching elements, such as a metal-oxide-semiconductor field-effect transistor (MOSFET), a bipolar transistor, or the like. The switching element 100 is connected between the upper main electrode 120 and the lower main electrode 130 as shown in FIG. 6. A cathode layer of the sense diode 110 is connected to the lower main electrode 130, whereas an anode layer of the sense diode 110 is connected to the sense anode electrode 140. The parasitic capacitance 150 exists between the sense anode electrode 140 and the upper main electrode 120.

In the semiconductor device shown in FIG. 6, when a potential of the upper main electrode 120 is higher than a potential of the lower main electrode 130, a potential of the sense anode electrode 140 is increased due to capacitance coupling via the parasitic capacitance 150. Consequently, a forward voltage is applied to the sense diode 110. Thus, a current flows through the sense diode 110 in the forward direction. At this time, holes are injected from the sense anode electrode 140 into the semiconductor substrate. Thereafter, when the potential of the upper main electrode 120 is reduced to a potential lower than the potential of the lower main electrode 130, the potential of the sense anode electrode 140 is reduced. Consequently, a voltage applied to the sense diode 110 is switched from a forward voltage to a reverse voltage. Then, the holes existing in the semiconductor substrate low toward the sense anode electrode 140, thereby allowing a reverse current to flow through the sense diode 110. The reverse current is generally called a recovery current. When a high recovery current flows through the sense diode 110, a high load is applied onto the sense diode 110.

Accordingly, it is an object of the present disclosure herein to provide a technique to suppress a recovery current of a sense diode.

A semiconductor device provided herein may comprise: a semiconductor substrate; an upper main electrode provided above the semiconductor substrate; a sense anode electrode provided above the semiconductor substrate; a resistance layer provided above the semiconductor substrate and having a resistivity higher than the sense anode electrode; and a lower main electrode provided below the semiconductor substrate. The semiconductor substrate may comprise a switching element and a sense diode. The switching element may be connected between the upper main electrode and the lower main electrode. The sense diode may comprise a first anode region of a p-type connected to the sense anode electrode via the resistance layer and a first cathode region of an n-type connected to the lower main electrode.

In the semiconductor device, the first anode region of the sense diode is connected to the upper main electrode via the resistance layer having a high resistivity. Thus, when a forward voltage is applied to the sense diode, a current flowing through the sense diode is low. Due to this, there are few holes injected from the sense anode electrode into the semiconductor substrate when the forward voltage is applied to the sense diode. Thereafter, when the voltage applied to the sense diode is switched to the reverse voltage, the holes in the semiconductor substrate are discharged into the sense anode electrode. Thus, a recovery current flows through the sense diode. Since there are few holes injected from the sense anode electrode to the semiconductor substrate when applying the forward voltage, there are also few holes discharged from the semiconductor substrate to the sense anode electrode when applying the reverse voltage. Therefore, the recovery current flowing through the sense diode is low. In this way, according to the semiconductor device, the recovery current in the sense diode can be suppressed.

DETAILED DESCRIPTION

Figure 1:
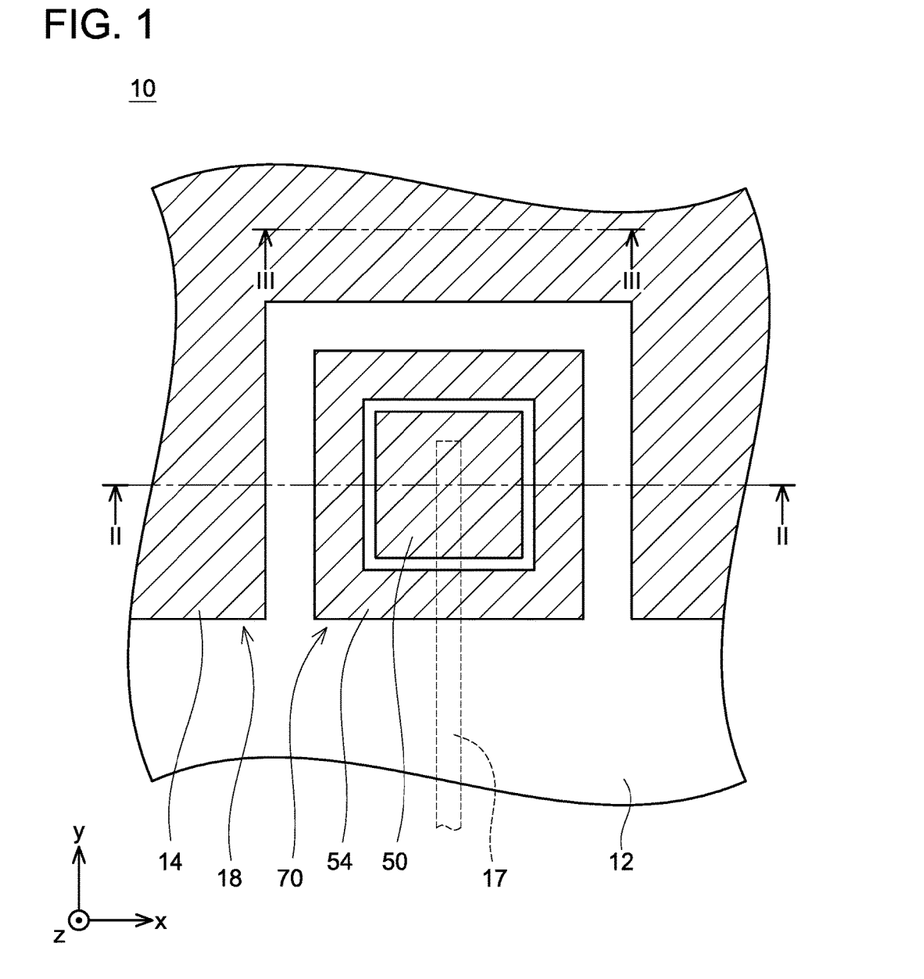
FIG. 1 is a top view of a semiconductor device according to one embodiment.
Figure 2:
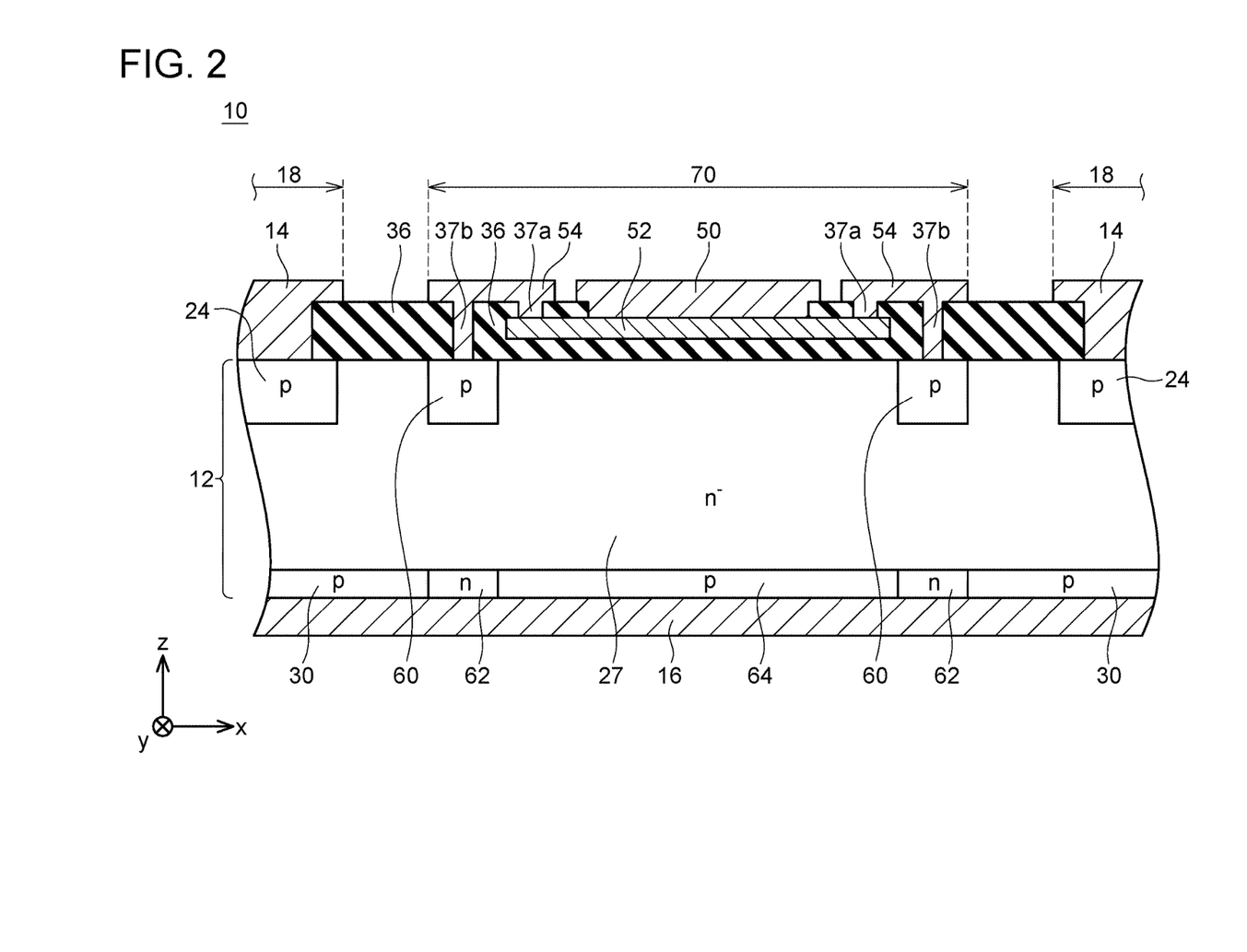
FIG. 2 is a cross-sectional view of the semiconductor device along a line II-II of FIG. 1.
Figure 3:
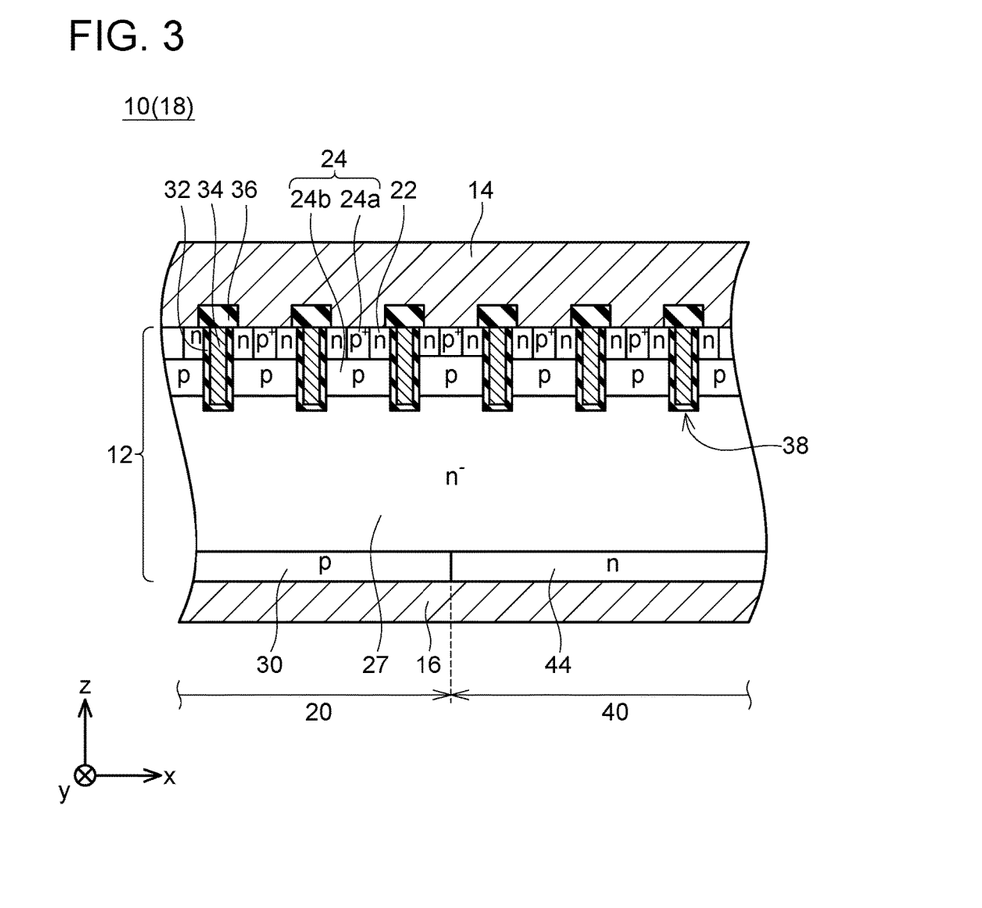
FIG. 3 is a cross-sectional view of the semiconductor device along a line III-III of FIG. 1.

A semiconductor device 10 shown in FIGS. 1 to 3 according to one embodiment has a semiconductor substrate 12. The semiconductor substrate 12 is a substrate constituted of silicon. As shown in FIG. 1, the semiconductor substrate 12 includes an element region 18 and a sense region 70. An area of the element region 18 is much larger than an area of the sense region 70. The sense region 70 is provided in a position adjacent to the element region 18. In the element region 18, IGBTs and freewheel diodes are provided as will be described later in detail. Further, a sense diode is provided in the sense region 70. Note that in the description below, a z direction is defined as a thickness direction of the semiconductor substrate 12, an x direction is defined as one direction parallel to an upper surface of the semiconductor substrate 12 (one direction perpendicular to the z direction), and a y direction is defined as one direction perpendicular to the z direction and the x direction.

As shown in FIG. 2, an upper surface of the semiconductor substrate 12 in the sense region 70 is covered with an interlayer insulating film 36. A sense anode electrode 50, a resistance layer 52, and a wiring layer 54 are provided above the interlayer insulating film 36.

The resistance layer 52 is constituted of polysilicon doped with impurities. The resistance layer 52 has a resistivity higher than each of the sense anode electrode 50 and the wiring layer 54. The resistance layer 52 is provided on the interlayer insulating film 36.

The sense anode electrode 50 is constituted of Al (aluminum) or AlSi (an alloy of aluminum and silicon). The sense anode electrode 50 is provided on the resistance layer 52. An upper surface of the sense anode electrode 50 serves as a bonding pad. The sense anode electrode 50 covers an upper surface of a central portion of the resistance layer 52. Thus, the central portion of the resistance layer 52 is positioned under the sense anode electrode 50 (i.e., bonding pad), whereas an outer peripheral portion of the resistance layer 52 is provided outside the sense anode electrode 50. That is, the resistance layer 52 has the central portion positioned under the bonding pad and the outer peripheral portion extending up to the outer side of the bonding pad.

The wiring layer 54 is constituted of Al or AlSi. The wiring layer 54 is provided on the interlayer insulating film 36. As shown in FIG. 1, the wiring layer 54 extends annularly to surround the sense anode electrode 50. A space is provided between the wiring layer 54 and the sense anode electrode 50. As shown in FIG. 2, a portion of the wiring layer 54 is provided above the outer peripheral portion of the resistance layer 52. Contact holes 37a and 37b are provided in the interlayer insulating film 36 located under the wiring layer 54. The wiring layer 54 is in contact with the resistance layer 52 in the contact hole 37a. The wiring layer 54 is in contact with the upper surface of the semiconductor substrate 12 within the contact hole 37b.

The resistance layer 52 and the wiring layer 54 configure a current path that connects the sense anode electrode 50 to the semiconductor substrate 12 (in more detail, an anode region 60 to be described later). As mentioned above, the resistivity of the resistance layer 52 is higher than the resistivity of each of the sense anode electrode 50 and the wiring layer 54. Thus, in the current path that leads from the bonding pad to the semiconductor substrate 12, the resistance of the resistance layer 52 is higher than the resistance of each of the sense anode electrode 50 and the wiring layer 54. As shown in FIG. 1, the end of a wire 17 is connected to an upper surface of the sense anode electrode 50 (i.e., bonding pad). Although not shown, the other end of the wire 17 is connected to an external circuit.

As shown in FIGS. 1 to 3, an upper main electrode 14 is provided above the element region 18. The upper main electrode 14 is constituted of Al or AlSi. The upper main electrode 14 is in contact with the upper surface of the semiconductor substrate 12 within the element region 18. The upper main electrode 14 is separated from the wiring layer 54.

As shown in FIGS. 2 and 3, a lower main electrode 16 is provided on a lower surface of the semiconductor substrate 12. The lower main electrode 16 is in contact with a substantially entire region of the lower surface of the semiconductor substrate 12.

As shown in FIG. 2, the anode region 60, a drift region 27, a cathode region 62, and a lower p-type region 64 are provided in the sense region 70.

The anode region 60 is a region of a p-type. The anode region 60 is provided in an area constituting the upper surface of the semiconductor substrate 12. The anode region 60 is provided under the wiring layer 54 and extends annularly along the wiring layer 54. The anode region 60 is in contact with the wiring layer 54 within the contact holes 37b. The anode region 60 is connected to the outer peripheral portion of the resistance layer 52 via the wiring layer 54 (i.e., a portion not covered with the sense anode electrode 50). The anode region 60 is connected to the sense anode electrode 50 via the wiring layer 54 and the resistance layer 52. The anode region 60 is not provided under (directly below) the sense anode electrode 50 (i.e., bonding pad).

The drift region 27 is a region of an n-type. The drift region 27 is provided below the anode region 60. Further, the drift region 27 spreads over the area at the upper surface of the semiconductor substrate 12 below the sense anode electrode 50. The resistivity of the resistance layer 52 is higher than a resistivity of a drift region 27 exhibited when a conductivity modulation phenomenon does not occur.

The cathode region 62 is a region of an n-type that has an n-type impurity concentration higher than the drift region 27. The cathode region 62 is provided below the drift region 27 and under (directly below) the anode region 60. The cathode region 62 is provided in an area at the lower surface of the semiconductor substrate 12. The cathode region 62 is in contact with the lower main electrode 16.

The lower p-type region 64 is a region of a p-type. The lower p-type region 64 is provided below the drift region 27 and under (directly below) the sense anode electrode 50. The lower p-type region 64 is in contact with the lower main electrode 16.

In the sense region 70, the sense diode is provided by the anode region 60, the drift region 27, and the cathode region 62.

As shown in FIG. 3, the element region 18 includes an IGBT region 20 in which the IBGTs are provided and a diode region 40 in which freewheel diodes are provided. The IGBT region 20 and the diode region 40 are adjacent to each other. Within the element region 18, the IGBT region 20 and the diode region 40 are alternately arranged repeatedly in the x direction.

A plurality of trenches 38 is provided at the upper surface of the semiconductor substrate 12 in the element region 18. The plurality of trenches 38 extends in parallel along the y direction at the upper surface of the semiconductor substrate 12. As shown in the cross-sectional view of FIG. 3, each trench 38 extends from the upper surface of the semiconductor substrate 12 along the z direction. The plurality of trenches 38 is provided in each of the IGBT regions 20 and the diode regions 40. The inner surface of each trench 38 is covered with a gate insulating film 32. A gate electrode 34 is provided in each trench 38. Each gate electrode 34 is insulated from the semiconductor substrate 12 by the corresponding gate insulating film 32. An upper surface of each gate electrode 34 is covered with the interlayer insulating film 36. Each gate electrode 34 is insulated from the upper main electrode 14 by the interlayer insulting film 36. Each gate electrode 34 in the IGBT region is connected to a gate wiring (not shown). Each gate electrode 34 in the diode region 40 may be connected to the gate wiring or may be a dummy electrode connected to the upper main electrode 14 or the like.

Emitter regions 22 and a p-type region 24 are provided in each region interposed between the two trenches 38. The emitter regions 22 and the p-type region 24 are provided in the IGBT region 20 and the diode region 40. Each emitter region 22 is a region of an n-type. The emitter regions 22 are provided in areas at the upper surface of the semiconductor substrate 12. Each of the emitter regions 22 is in contact with the upper main electrode 14. The emitter region 22 is in contact with the gate insulating film 32 at the upper end of each trench 38. The p-type region 24 has high-concentration regions 24a and a low-concentration region 24b. Each of the high-concentration region 24a has a p-type impurity concentration higher than the low-concentration region 24b. Each high-concentration region 24a is provided in an area at the upper surface of the semiconductor substrate 12. Each high-concentration region 24a is in contact with the upper main electrode 14. The low-concentration region 24b is provided below the high-concentration region 24a and the emitter regions 22. The low-concentration region 24b is in contact with the gate insulating film 32 below the emitter regions 22. A portion of the p-type region 24 in the IGBT region 20 functions as a body region of the IGBT. Meanwhile, a portion of the p-type region 24 in the diode region 40 function as an anode region of the freewheel diode. It is noted that while FIG. 3 shows that the emitter regions 22 are provided in the diode region 40, no emitter region 22 may be provided in the diode region 40.

The drift region 27 is provided below the p-type region 24 in the IGBT regions 20 and the diode regions 40. That is, the drift region 27 spreads over the sense region 70, the IGBT regions 20, and the diode regions 40. The drift region 27 is in contact with the gate insulating film 32 below the p-type regions 24. The drift region 27 is separated from the emitter regions 22 by the p-type region 24.

A collector region 30 is provided below the drift region 27 in each IGBT region 20. The collector region 30 is a region of a p-type. The collector region 30 is provided in an area at the lower surface of the semiconductor substrate 12. The collector region 30 is in contact with the lower main electrode 16. The collector region 30 is separated from the p-type region 24 by the drift region 27.

A cathode region 44 is provided below the drift regions 27 in each diode region 40. The cathode region 44 is a region of an n-type that has an n-type impurity concentration higher than the drift region 27. The cathode region 44 is provided in an area at the lower surface of the semiconductor substrate 12. The cathode region 44 is in contact with the lower main electrode 16.

In the IGBT region 20, each of the IGBTs is constituted of the emitter regions 22, the p-type region 24 (i.e., body region), the drift region 27, the collector region 30, the gate electrodes 34, the gate insulating films 32, and the like. When the semiconductor device 10 operates as the IGBT, the upper main electrode 14 functions as an emitter electrode, and the lower main electrode 16 functions as a collector electrode.

In the diode region 40, the freewheel diode is constituted of the p-type region 24 (i.e., anode region), the drift region 27, the cathode region 44, and the like. When the semiconductor device 10 operates as the freewheel diode, the upper main electrode 14 functions as an anode electrode, and the lower main electrode 16 functions as a cathode electrode.

Figure 4:
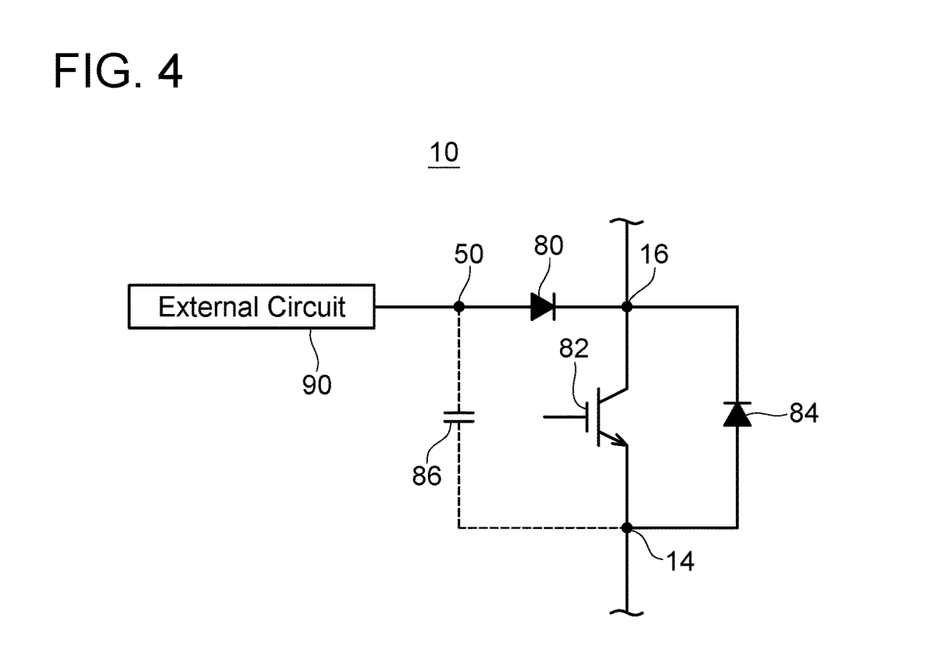
FIG. 4 is a circuit diagram of the semiconductor device according to the one embodiment.

FIG. 4 shows an internal circuit of the semiconductor device 10. Referring to FIG. 4, IGBT 82 indicates each of the IGBTs provided in the IGBT region 20, a freewheel diode 84 indicates each of the freewheel diodes provided in the diode region 40, and a sense diode 80 indicates a sense diode provided in the sense region 70. A collector of the IGBT 82 is connected to the lower main electrode 16, and an emitter of the IGBT 82 is connected to the upper main electrode 14. An anode of the freewheel diode 84 is connected to the upper main electrode 14, whereas a cathode of the freewheel diode 84 is connected to the lower main electrode 16. That is, the freewheel diode 84 is connected in antiparallel with the IGBT 82. A cathode of the sense diode 80 is connected to the lower main electrode 16. Meanwhile, an anode of the sense diode 80 is connected to the sense anode electrode 50. The sense anode electrode 50 is connected to an external circuit 90 via the wire 17 (see FIG. 1) or the like. The external circuit 90 controls the potential of the gate electrode of the IGBT 82 according to the potential of the sense anode electrode 50. The potential of the sense anode electrode 50 varies depending on the potential of the lower main electrode 16. The potential of the lower main electrode 16 varies depending on operating states of the IGBT 82 and the freewheel diode 84, and the like. Therefore, the external circuit 90 detects the potential of the sense anode electrode 50, thereby making it possible to appropriately control the IGBT 82. Further, as shown in FIGS. 1 and 2, the sense anode electrode 50 and the wiring layer 54 are provided near the upper main electrode 14. Thus, a relatively large parasitic capacitance exists between the sense anode electrode 50 and the upper main electrode 14. Referring to FIG. 4, the parasitic capacitance is denoted by a capacitance 86.

The voltage between the upper main electrode 14 and the lower main electrode 16 varies depending on the operating states of the IGBT 82 and the freewheel diode 84, or an operating state of a circuit connected to the upper main electrode 14 and the lower main electrode 16. When the potential of the upper main electrode 14 increases to a potential higher than the potential of the lower main electrode 16, a forward current flows through the freewheel diode 84. Furthermore, when the potential of the upper main electrode 14 increases to a potential higher than the potential of the lower main electrode 16, the potential of the sense anode electrode 50 increases due to capacitance coupling via the parasitic capacitance 86. Consequently, the potential of the sense anode electrode 50 becomes higher than the potential of the lower main electrode 16. Thus, a forward current flows through the sense diode 80. At this time, holes are injected from the anode regions 60 into the drift region 27. Subsequently, when the potential of the upper main electrode 14 is reduced to a potential lower than the potential of the lower main electrode 16, the voltage applied to the freewheel diode 84 is switched from the forward voltage to the reverse voltage, allowing a recovery current to flow through the freewheel diode 84. Furthermore, when the potential of the upper main electrode 14 is reduced to a potential lower than the potential of the lower main electrode 16, the potential of the sense anode electrode 50 is reduced due to capacitance coupling via the parasitic capacitance 86. Consequently, the potential of the sense anode electrode 50 becomes lower than the potential of the lower main electrode 16. Thus, the voltage applied to the sense diode 80 is switched from the forward voltage to the reverse voltage. As a result, a recovery current flows through the sense diode 80. When a high recovery current flows through the sense diode 80, a high load is applied onto the sense diode 80.

However, in the semiconductor device 10 of the present embodiment, the sense anode electrode 50 is connected to the anode region 60 via the resistance layer 52 having a high resistivity. Thus, when the forward voltage is applied, a current hardly flows through the sense diode 80. That is, a forward voltage drop of the sense diode 80 is large. Due to this, there are few holes injected from the anode region 60 into the drift region 27 when the forward voltage is applied to the sense diode 80. Thereafter, when the reverse voltage is applied to the sense diode 80, the holes existing in the drift region 27 are discharged to the sense anode electrode 50, thereby allowing a recovery current to flow through the sense diode 80. Since there are few holes injected into the drift region 27 when applying the forward voltage, there are also few holes discharged from the drift region 27 when applying the reverse voltage. Therefore, in the semiconductor device 10 of the present embodiment, the recovery current hardly flows through the sense diode 80. Due to this, the load on the sense diode 80 is reduced, thereby improving the reliability of the sense diode 80.

In the semiconductor device 10 of the present embodiment, the resistivity of the resistance layer 52 is higher than the resistivity of the drift region 27. Thus, the forward voltage drop of the sense diode 80 can be effectively increased by the resistance layer 52. For this reason, the recovery current in the sense diode 80 can be suppressed more effectively.

In the above-mentioned embodiment, the anode region 60 is not provided under the sense anode electrode 50 (i.e., bonding pad). Thus, the impact caused in the wire bonding can hardly be applied to the anode regions 60. For this reason, occurrence of defects or the like in the anode regions 60 can be prevented. Consequently, a leakage current or the like of the sense diode 80 can be suppressed. Further, the resistance layer 52, which is constituted of polysilicon, is provided under the sense anode electrode 50 (i.e., bonding pad). By providing the polysilicon layer under the bonding pad in this way, the semiconductor substrate 12 can be protected by the polysilicon layer during the wire bonding. For this reason, damages to the semiconductor substrate 12 can be reduced during the wire bonding.

In a manufacturing procedure of the semiconductor device 10 in the above-mentioned embodiment, the resistance layer 52 and the interlayer insulating film 36 are formed to embed the resistance layer 52 in the interlayer insulating film 36. Then, contact holes, including the contact holes 37a and 37b, are formed. Thereafter, the sense anode electrode 50, the wiring layer 54, and the upper main electrode 14 can be formed. The contact holes are formed by etching the interlayer insulating film 36. At this time, in a position where the resistance layer 52 is present, the etching is stopped at the resistance layer 52, while in a position where the resistance layer 52 is not present, the etching is stopped at the semiconductor substrate 12. Accordingly, the contact holes (for example, the contact holes 37a) leading to the resistance layer 52 and the contact holes (for example, contact holes 37b) leading to the semiconductor substrate 12 can be formed at the same time. Due to this, thereafter, the sense anode electrode 50, the wiring layer 54, and the upper main electrode 14 can be formed at the same time. Thus, the semiconductor device 10 of the present embodiment can be manufactured with substantially the same efficiency as a conventional semiconductor device.

Figure 5:
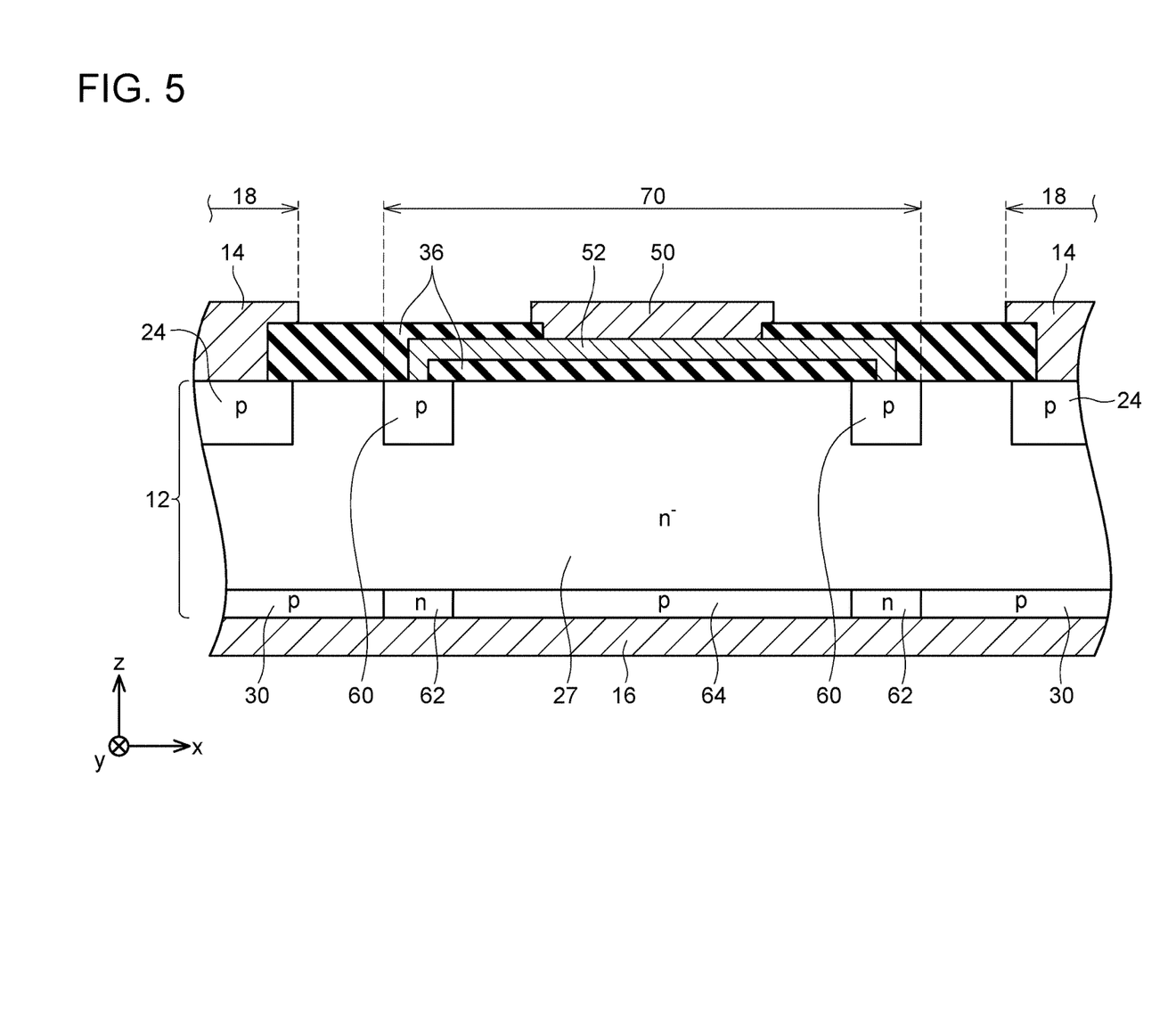
FIG. 5 is a cross-sectional view corresponding to FIG. 2, showing a semiconductor device according to a modification.

Note that in the above-mentioned embodiments, the resistance layer 52 is connected to the anode region 60 via the wiring layer 54. However, as shown in FIG. 5, the resistance layer 52 may be in direct contact with the anode region 60. In this case, the resistance layer 52 may be constituted of polysilicon. When the resistance layer 52 is constituted of polysilicon in the configuration shown in FIG. 5, holes are allowed to flow from the anode region 60 to the resistance layer 52 upon application of the reverse voltage. A carrier lifetime in the polysilicon is short. For this reason, many holes are recombined with electrons to vanish when passing through the resistance layer 52. Due to this, the recovery current can be further reduced.

In the above-mentioned embodiment, the IGBTs are provided in the element region 18. Alternatively, other switching elements, such as MOSFETs, may be provided instead of the IGBTs in the element region 18.

In the above-mentioned embodiment, the entire upper surface of the sense anode electrode 50 serves as the bonding pad. Alternatively, a portion of the upper surface of the sense anode electrode 50 may serve as the bonding pad.

In the above-mentioned embodiment, the wiring layer 54 surrounds a periphery of the sense anode electrode 50. However, as long as the resistance layer 52 is present in the current path between the sense anode electrode 50 and the anode region 60, an arrangement of the sense anode electrode 50, the resistance layer 52, and the wiring layer 54 may be changed appropriately. Alternatively, as mentioned above, the wiring layer 54 may not be present.

A relationship between components in the above-mentioned embodiments and components of the claims will be described below. The anode region 60 in the embodiment is an example of a first anode region described in the claims. The cathode region 62 in the embodiment is an example of a first cathode region described in the claims. The p-type region 24 in the diode region 40 of the embodiment is an example of a second anode region described in the claims. The cathode region 44 in the embodiment is an example of a second cathode region described in the claims.

Some of the features characteristic to the disclosure herein will be listed. It should be noted that the respective technical elements are independent of one another, and are useful solely or in combinations.

In a semiconductor device disclosed herein as an example, the sense anode electrode may comprise a bonding pad configured so that a wire is bonded to the bonding pad. The resistance layer may comprise a first portion connected to the sense anode electrode under the bonding pad and a second portion extending outward from the bonding pad. The first anode region may not be provided under the bonding pad and may be connected to the sense anode electrode via the second portion.

With this configuration, impact caused in the wire bonding can hardly be applied to the first anode region, making it possible to prevent occurrence of defects in the first anode region.

In a configuration in which the resistance layer is provided under the bonding pad, the resistance layer may be constituted of polysilicon.

By providing the polysilicon with high resistance to impact under the bonding pad, any defect due to the impact in the wire bonding can be suppressed.

A semiconductor device disclosed herein as an example may further comprise a wiring layer provided above the semiconductor substrate. The wiring layer may have a resistivity lower than the resistance layer, and be in contact with the first anode region. In this configuration, the first anode region may be connected to the resistance layer via the wiring layer.

In another semiconductor device disclosed herein as an example, the first anode region may be in direct contact with the resistance layer. In this configuration, the resistance layer may be constituted of polysilicon.

A carrier lifetime in the polysilicon is short. With this configuration, when the reverse voltage is applied to the sense diode, holes discharged from the semiconductor substrate into the sense anode electrode are allowed to pass through the resistance layer constituted of polysilicon. Thus, the holes are apt to be recombined with electrons to vanish in the resistance layer. Accordingly, the recovery current can be further suppressed.

In a semiconductor device disclosed herein as an example, the semiconductor substrate may comprise a drift region of the n-type provided between the first anode region and the first cathode region. The drift region may have an n-type impurity concentration lower than the first cathode region. The resistance layer may have the resistivity higher than a resistivity of the drift region.

With this configuration, the recovery current in the sense diode can be farther suppressed.

In a semiconductor device disclosed herein as an example, the semiconductor substrate may comprise a freewheel diode. The freewheel diode may comprise a second anode region of the p-type connected to the upper main electrode, and a second cathode region of the n-type connected to the lower main electrode.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device, comprising:
a semiconductor substrate;
an upper main electrode provided above the semiconductor substrate;
a sense anode electrode provided above the semiconductor substrate;
a resistance layer provided above the semiconductor substrate, the resistance layer being configured to allow electric current to flow therethrough and having a resistivity higher than the sense anode electrode; and
a lower main electrode provided below the semiconductor substrate, wherein
the semiconductor substrate comprises a switching element and a sense diode,
the switching element is connected between the upper main electrode and the lower main electrode,
the sense diode comprises a first anode region of a p-type electrically connected to the sense anode electrode via the resistance layer and a first cathode region of an n-type connected to the lower main electrode,
the sense anode electrode comprises a bonding pad configured so that a wire is bonded to the bonding pad,
the resistance layer comprises a first portion connected to the sense anode electrode under the bonding pad and a second portion extending outward from the bonding pad, and
the first anode region is not provided under the bonding pad and is connected to the sense anode electrode via the second portion.

2. The semiconductor device of claim 1, wherein the resistance layer is constituted of polysilicon.

3. A semiconductor device, comprising:
a semiconductor substrate;
an upper main electrode provided above the semiconductor substrate;
a sense anode electrode provided above the semiconductor substrate;
a resistance layer provided above the semiconductor substrate, the resistance layer being configured to allow electric current to flow therethrough and having a resistivity higher than the sense anode electrode;
a lower main electrode provided below the semiconductor substrate, wherein
the semiconductor substrate comprises a switching element and a sense diode,
the switching element is connected between the upper main electrode and the lower main electrode, and
the sense diode comprises a first anode region of a p-type electrically connected to the sense anode electrode via the resistance layer and a first cathode region of an n-type connected to the lower main electrode; and
a wiring layer provided above the semiconductor substrate, the wiring layer having a resistivity lower than the resistance layer, and being in contact with the first anode region,
wherein the first anode region is connected to the resistance layer via the wiring layer.

4. A semiconductor device, comprising:
a semiconductor substrate;
an upper main electrode provided above the semiconductor substrate;
a sense anode electrode provided above the semiconductor substrate;
a resistance layer provided above the semiconductor substrate, the resistance layer being configured to allow electric current to flow therethrough and having a resistivity higher than the sense anode electrode; and a lower main electrode provided below the semiconductor substrate, wherein the semiconductor substrate comprises a switching element and a sense diode, the switching element is connected between the upper main electrode and the lower main electrode, the sense diode comprises a first anode region of a p-type electrically connected to the sense anode electrode via the resistance layer and a first cathode region of an n-type connected to the lower main electrode, the semiconductor substrate further comprises a freewheel diode, and the freewheel diode comprises a second anode region of the p-type connected to the upper main electrode, and a second cathode region of the n-type connected to the lower main electrode.

\* \* \* \* \*